United States Patent [19]

Lenz et al.

[11] Patent Number: 4,634,977
[45] Date of Patent: Jan. 6, 1987

[54] HIGH ACCURACY MAPPING OF MAGNETIC FIELDS WITH A FIBER OPTIC INTERFEROMETER

[75] Inventors: James E. Lenz, Brooklyn Park; Gordon L. Mitchell, New Brighton, both of Minn.

[73] Assignee: Honeywell Inc., Minneapolis, Minn.

[21] Appl. No.: 453,196

[22] Filed: Dec. 27, 1982

[51] Int. Cl.⁴ .......................................... G01R 33/032
[52] U.S. Cl. ..................................... 324/244; 324/260
[58] Field of Search ............... 324/200, 244, 260, 345, 324/96; 250/227; 350/374–376

[56] References Cited

U.S. PATENT DOCUMENTS

| | | | |
|---|---|---|---|
| 2,931,974 | 4/1960 | McLaughlin et al. | 324/345 |
| 4,071,818 | 1/1978 | Krisst . | |
| 4,191,470 | 3/1980 | Butter . | |
| 4,376,248 | 3/1983 | Giallorenzi et al. | 324/244 X |
| 4,433,291 | 2/1984 | Yariv et al. | 324/260 X |
| 4,450,406 | 5/1984 | Bobb | 324/244 X |
| 4,471,219 | 9/1984 | Giallorenzi | 324/244 X |

FOREIGN PATENT DOCUMENTS 1340198 12/1973 United Kingdom ................ 324/244

OTHER PUBLICATIONS

S. C. Rashleigh, "Magnetic-Field Sensing with a Single-Mode Fiber", Jan. 1981, vol. 6, No. 1, *Optics Letters.*
Dandridge, et al, "Sensors", 9th Apr. 1980.
G. B. Hocker, "Fiber-Optic Sensing of Pressure and Temperature", 1 May 1979, vol. 18, No. 9, *Applied Optics.*
Yariv and Winsor, "Proposal For Detection of Magnetic Fields Through Magnetorestrictive Pertubation of Optical Fibers", Mar. 1980, vol. 5, No. 3, *Optics Letters.*
Dandridge, et al, *Electronics Letter,* 23rd Jul. 1981, vol. 17, No. 15, "Interferometric Current Sensors Using Optical Fibres".
J. Jarzynski, et al, "Magnetic Field Sensitivity of An Optical Fiber with Magnetostrictive Jacket", *Applied Optics,* vol. 19, No. 22, 15 Nov. 1980.

*Primary Examiner*—Gerard R. Strecker
*Attorney, Agent, or Firm*—William T. Udseth

[57] ABSTRACT

A method of mapping at least a portion of a magnetic field with an interferometer is presented. The interferometer includes an optical fiber clad with a magnetostrictive material. The approximate direction of the magnetic field lines are determined and the optical fiber is placed substantially transverse to the magnetic field lines. The output of the interferometer is recorded for various positions of the optical fiber. The fiber can be maintained substantially transverse to the magnetic field lines during mapping, or the fiber can be positioned substantially transverse to the field lines to precisely determine the direction of field lines and substantially parallel to the field lines to determine field magnitude. In one embodiment the interferometer is adapted to produce a null output for a predetermined value of the integral of the magnetic field along the length of the optical fiber, and the optical fiber is of uniform construction. In this embodiment, the loci of reference points corresponding to null outputs provides a mapping of points of symmetry in the magnetic field. The direction of magnetic field lines at a point in space is also determined by seeking the minimum output of the interferometer by scanning about the point with the optical fiber.

18 Claims, 16 Drawing Figures

HIGH ACCURACY MAPPING OF MAGNETIC FIELDS WITH A FIBER OPTIC INTERFEROMETER

BACKGROUND OF THE INVENTION

1. Field of the Invention

This invention relates to methods of mapping magnetic fields with a fiber optic interferometer wherein an optical fiber is clad with a magnetostrictive material. Field mapping is facilitated by placement of the optical fiber substantially transverse to the magnetic field lines.

2. Description of the Prior Art

A form of a Mach-Zehnder interferometer using single-mode optical fibers for the two arms of the device as a means of measuring pressure and temperature is known. Such a device is analyzed in "Fiber-Optic Sensing of Pressure and Temperature" G. B. Hocker, *Applied Optics* Vol. 18 No. 9, 1 May 1979, pps. 1445–1448. Similar to the device described by Hocker is a laser fiber-optic interferometric strain gage described in U.S. Pat. No. 4,191,470, issued Mar. 4, 1980 to C. D. Butter.

Furthermore, A. Yariv and H. V. Winsor have proposed the detection of weak magnetic fields by magnetostrictive straining of optical fibers in "Proposal For Detection Of Magnetic Fields Through Magnetostrictive Perturbation Of Optical Fibers" *Optic Letters* Vol. 5, No. 3 March 1980, pps. 87–89. Therein, it is stated that the output of a magnetostrictive clad optical fiber and a reference fiber (which is insensitive to an external magnetic field) can be mixed in a standard interferometric system, with the phase delay in the magnetostrictive fiber due to the change in the length and index of refraction of the clad fiber, producing an interference pattern between the outputs of the fibers.

The computations of Yariv and Winsor are extended in "Magnetic Field Sensitivity Of An Optical Fiber With Magnetostrictive Jacket", J. Jarzynski, J. H. Cole, J. A. Bucaro, and C. M. Davis, Jr. *Applied Optics* Vol. 19 No. 22, 15 Nov. 1980, pps. 3746–3748. Yariv and Winsor had considered only the limiting case of an infinite nickel magnetostrictive jacket where it was assumed that the strains in the glass center are equal to the strains in the jacket material. The Jarzynski et al article presents calculations for the case of a finite thickness jacket for a number of magnetostrictive materials.

For some applications, particularly where large magnetic fields are present, high precision in the location of magnetic field lines is important. For example, in fusion reaction research, plasmas are confined in torus structures by powerful magnetic fields. It is important that the plasma be confined to particular volumes for maximum times while the plasma is heated. Misalignment of the magnets which generate the confining field will allow particles of the plasma to spiral away from the desired circular path around the circular axis of the torus, cool and impede experiments.

Heretofore, no method employing magnetostrictive interferometric devices to provide high precision mapping of magnetic field lines has been disclosed.

SUMMARY OF THE INVENTION

Using an interferometer which includes an optical fiber clad with a magnetostrictive material (i.e., a sensor optical fiber), at least a portion of a magnetic field is mapped. Magnetic field strength is mapped by first determining the approximate direction of the magnetic field lines. The optical fiber is then placed in the magnetic field substantially transverse to the field lines in the region of interest. By keeping the angular orientation in space of the optical fiber constant while variously positioning the optical fiber, a mapping is provided. Placing the optical fiber substantially transverse to the field lines heightens the sensitivity of the mapping compared to placing the optical fiber substantially along the magnetic field lines.

The interferometer can be further adapted to produce a preselected output for a predetermined value of the integral of the magnetic field along the length of the optical fiber. The optical fiber is then variously positioned within the magnetic field until the preselected output is obtained from the interferometer. The position of a reference point on the optical fiber is recorded each time the preselected output is obtained to facilitate mapping of the field.

For an optical fiber of uniform construction along its length, with a reference point at the center of the fiber, and where the predetermined value is zero, the interferometer is a null sensing device. In this null sensing configuration, the loci of points corresponding to null outputs maps points of symmetry in the magnetic field.

The direction of magnetic field lines at a point in space is determined with the interferometer. The optical fiber is positioned so that the point in space lies on the fiber and the fiber is rotated about the point until the interferometer output is a minimum. When the interferometer output is a minimum, the optical fiber is substantially perpendicular to the magnetic field lines at the point in space.

An alternative method of mapping is to determine the approximate direction of the magnetic field lines; place the optical fiber substantially transverse to the field lines; scan for a minimum output by rotating the optical fiber; and move fiber in small increments, stopping to confirm the direction of the field lines after each move. The fiber may be oriented along the field lines while the fiber is moved between stops, with the interferometer output held constant as the fiber moves.

Means for implementing the above methods are also disclosed.

DESCRIPTION OF THE PREFERRED EMBODIMENT

Figure 1:
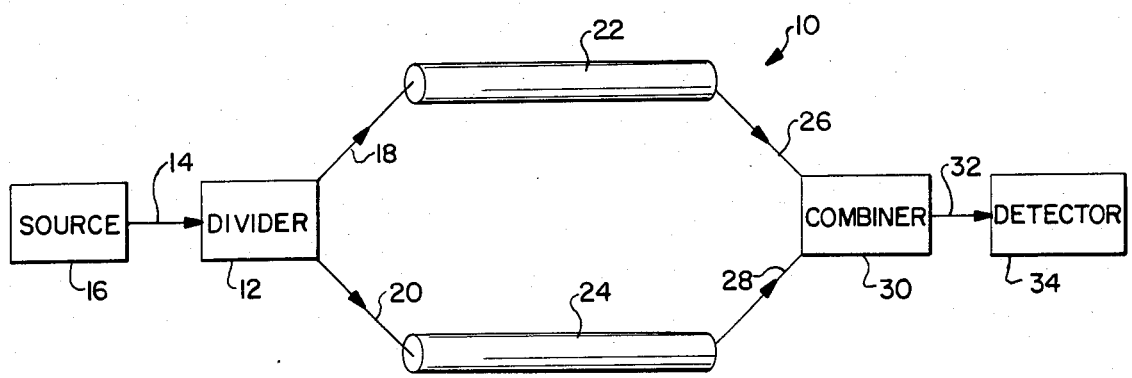
FIG. 1 is a schematic of a prior art basic fiber optic interferometer.

Fiber optic interferometer 10 (FIG. 1) includes power divider 12 for dividing an input beam 14 from light source 16. Source 16 is preferably a narrow band laser. Power divider 12 is adapted to split beam 14 into beams 18 and 20 which are optically coupled, respectively, into single-mode optical fibers 22 and 24. Fiber 22 is a sensor fiber and fiber 24 is a reference fiber.

Output beams 26 and 28 exit from fibers 22 and 24, respectively, and are combined in power combiner 30. The combined output 32 from power combiner 30 is directed to light detector 34.

Figure 2:
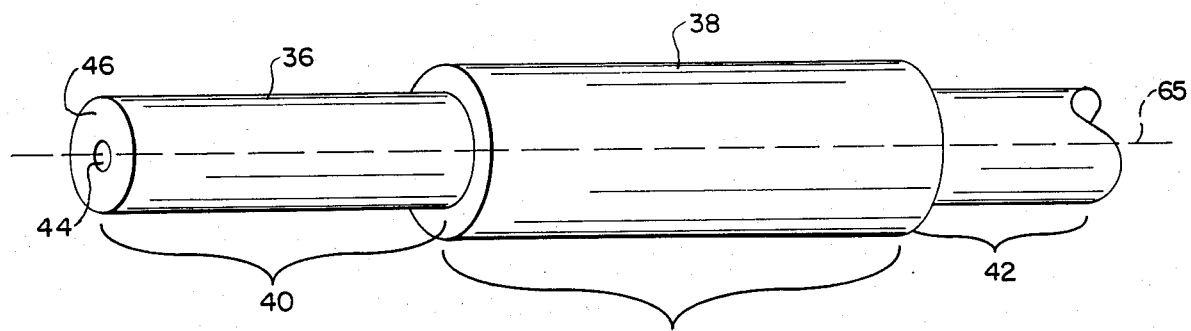
FIG. 2 is an enlarged partial view of FIG. 1 including the sensor optical fiber.

Sensor fiber 22 is enlarged in FIG. 2. Sensor fiber 22 is that portion of a single-mode fiber 36 which is clad with a magnetostrictive material 38 which is on the order of 10 to 20 microns thick. A first portion 40 of fiber 36 leads to sensor fiber 22 and a second portion 42 of fiber 36 leads from sensor fiber 22. Portions 40 and 42 are employed to optically couple beams 18 and 26 from and to divider 12 and combiner 30, respectively. Additional lengths of optical fibers (not shown) can be similarly used to couple beams 20 and 28 between divider 12, combiner 30 and fiber 24.

Figure 3:
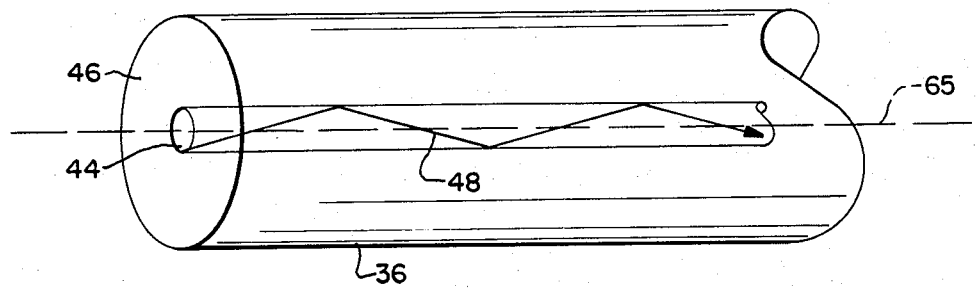
FIG. 3 is an enlarged partial view of a single mode optical fiber of FIG. 1.

As seen in FIG. 3, fiber 36 contains a narrow core region 44 (on the order of 5 microns in diameter) of optical index of refraction n1. Core 44 is first clad with a jacket 46 of a material of a second optical index of refraction n2, where n2 < n1. The diameter of fiber 36 is typically on the order of 100 microns. As is well known, when n2 < n1, for very thin optical fibers, only a single mode of beam 48 will propagate along core 44. The number of modes capable of propagating along a fiber being governed by:

$$V = \frac{2\pi a}{\lambda} (n_1^2 - n_2^2)^{\frac{1}{2}} \quad (1)$$

where
$\lambda$ = the free space wavelength of the light used
n1 = the index of refraction of the core of the fiber
n2 = the index of refraction of the cladding and
a = the radius of the core.

Fiber 24 has the same cross-sectional construction as portions 40 or 42 of fiber 36.

Figure 4:
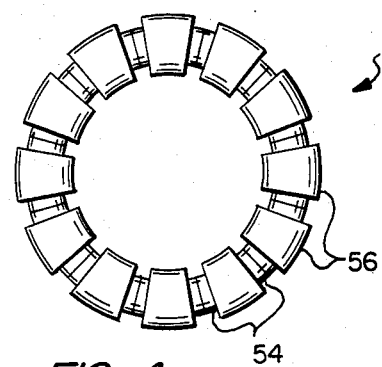
FIG. 4 is a top view of a schematic of the confinement torus of a toroidal fusion research reactor.
Figure 5:
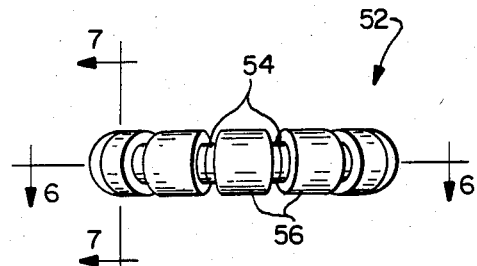
FIG. 5 is a plan view of the structure of FIG. 4.

One technique employed in fusion reactor research is to confine a plasma 50 (see FIG. 6) in a magnetic field. Referring to FIGS. 4 and 5, a convenient confinement structure is a torus 52 having annular split coil magnets 54 uniformly spaced around the circumference of torus 52. Microwave energy is pumped into plasma 50 by means of spaced collars 56 disposed around the circumference of torus 52 between magnets 54. Collars 56 include ports (not shown) adapted to allow microwave sources (not shown) to irradiate plasma 50 while it is in torus 52.

Figure 6:
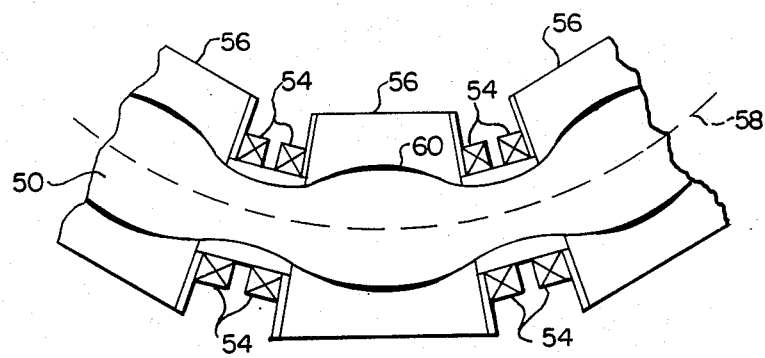
FIG. 6 is an enlarged, partial cross-sectional view of FIG. 5 along line 6—6.

As seen in FIG. 6, plasma 50 is ideally configured as a "bumpy torus" within torus 52. That is, the magnetic field lines due to magnets 54 generally form concentric circles on or near the circular central axis 58 of torus 52 and bulge out between magnets 54. Plasma 50 is heated to approach fusion conditions by microwave energy as indicated above. Often one limiting means to confine plasma 50 are electron annuluses 60 generated by pumping plasma 50 with microwave energy at the cyclotron resonance frequency of torus 52.

In fusion reactor research, it is crucial that the magnetic field lines of the confining field close (i.e., repeat their shape over $2\pi$ radians with the field lines smoothly connected at $2\pi$ radians). A closed field confines plasma 50 so that it will not drift from the bumpy torus configuration of FIG. 6. If plasma 50 drifts away from the bumpy torus field, energy cannot be efficiently pumped into plasma 50 and it cools. The alignment of magnets 54 to provide a precisely shaped confining magnetic field is therefore very important. Likewise, the location of a particular magnetic field line, especially near the edge of the magnetic field (i.e., near the "limiters" whether the limiters are cavity walls or electron annuluses), is important so that the confining field fits within torus 52 and meets with other desired parameters.

Figure 7:
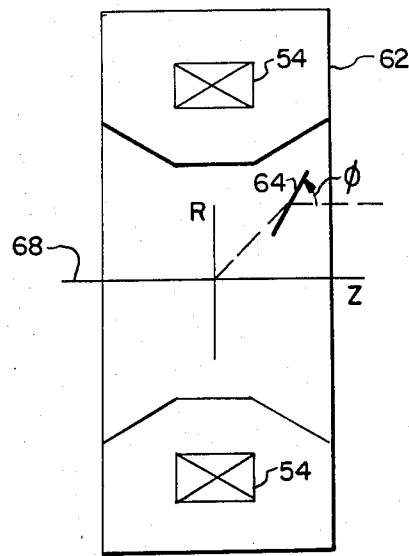
FIG. 7 is a partial, cross-sectional view of FIG. 5 along line 7—7, illustrating coordinates for mapping the magnet field in the fusion reactor of FIG. 4.

FIG. 7 shows circular cylindrical coordinates R and Z conveniently chosen in modeling the bumpy torus magnetic field. Magnet 54 is depicted in FIG. 7 in cross section. Magnet 54 is surrounded by an area 62 which represents shielding and cooling mechanisms. In actual operation magnet 54 is cooled to a superconducting state. For a circular current loop (which magnet 54 in FIG. 7 represents) the magnetic field is symmetrical about axis 68, thus the third traditional variable $\phi$ is used to represent a different angle than the angle of a plane including the Z axis. $\phi$ represents the angle probe 64 forms with the Z axis. Probe 64 will contain at least sensor optical fiber 22 and optical fiber 24 in close proximity to each other.

Device 10 will be employed to sense magnetic field strengths by placing probe 64 in the field to be measured. Fiber 22 will undergo a longitudinal strain due to the magnetostrictive interaction of the magnetic field and cladding 38. This strain will alter the index of refraction along the longitudinal axis 65 of fiber 22 as well as alter the length of fiber 22. In turn, light propagating along fiber 22 will experience a phase change equal to the sum of the phase change due to the change in index of refraction as well as that due to the change in length. The equations governing the phase change for weak magnetic fields are given by Yariv and Winsor (see above citation) and further computations are contained in the article by Jarzynski et al also cited above.

If light source 16 is activated, beams 18 and 20 will enter fibers 22 and 24 in phase, but magnetostrictive effects in fiber 22 will cause beams 26 and 28 to exit fibers 22 and 24 out of phase. When combined in combiner 30, interference will occur with a variation in the combined output 32 being sensed by detector 34. A readout from detector 34 can be adapted to indicate variations in magnetic field strength as a function of detector output.

To insure that the interference of output beams 26 and 28 is due solely to magnetostrictive effects, optical pathlengths of beams propagating between divider 12 and combiner 30 are preferably identical except for the length change due to magnetostriction. A variation towards this end would be to clad fiber 24 (this additional cladding, which is not shown, extending for the same length along fiber 24 as cladding 38 extends along fiber 36) with a metal which has similar thermal properties to cladding 38, but which is not magnetostrictive (i.e., it is nonferromagnetic).

Only the component of the external magnetic field along fiber 22 will contribute to a phase shift for light propagating along fiber 22. Thus, the magnitude of the magnetic field contributing to the magnetostrictive effect on fiber 22 ($|b|$) due to an external magnetic field B, is given by:

$$|b| = \frac{1}{L} \int_0^L \vec{B} \cdot \vec{dl}, \quad (2)$$

where L=the length of fiber 22. Preferably the output of device 10 will be calibrated to display $|b|$ directly. The output of device 10 is therefore an average over the length of fiber 22.

If a reference point is chosen on fiber 22 (e.g., the center 70 of fiber 22), mapping of B at the reference point is provided by variously positioning fiber 22 within magnetic field B. Due to the directional dependence of fiber 22, the magnetic field readings $|b|$ for two points may, of course, only be directly compared if the angular orientation of fiber 22 is the same with respect to the direction of the magnetic field lines at those two points.

Changes in $|b|$ between two points in space when the angular orientation in space of fiber 22 is constant, can be due to differences in field intensity, field direction or both direction and intensity at the two points. Ideally, either the direction of the magnetic field lines will be known and the angular orientation of fiber 22 with respect to the field lines will be held constant during mapping so that an intensity profile can be defined or the intensity of the field will be known and by mapping with the angular orientation of fiber 22 held constant with respect to some axis (i.e. $\phi$ is constant) a mapping of line curvature is provided. A more general mapping procedure is described below.

Figure 8:
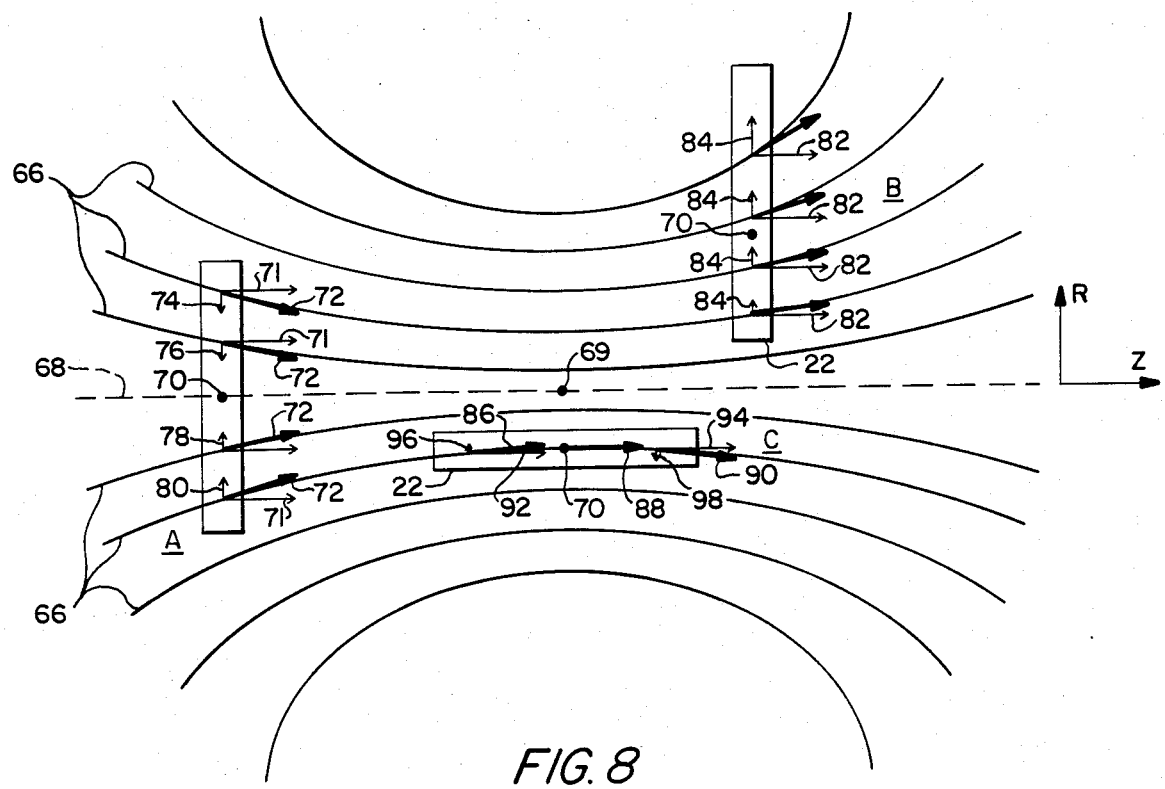
FIG. 8 is an enlarged view of magnetic field lines which are generated by the structure of FIG. 7, including three possible positions of the sensor optical fiber of the fiber-optic interferometer.

FIG. 8 illustrates the directional dependence of fiber 22 (and likewise probe 64) in a magnetic field due to a current loop. FIG. 8 employs the same coordinates as FIG. 7. Lines 66 represents magnetic field lines of constant magnitude for a magnetic field B (R,Z,$\theta$) and dashed line 68 represents a magnetic axis (i.e., B is symmetric in the R direction about axis 68). The field B has a magnetic center 69 about which B is spherically symmetric. The magnitude of the magnetic field B at a point in space is represented by darkened vector lines along field lines 66. Each darkened vector is broken down into its components in the Z and R directions (all components lie in the plane of the page for the three cases depicted in FIG. 8).

When fiber 22 is in a first position labeled A, the center 70 of fiber 22 lies on axis 68 (i.e., R=0) and $\phi$=90°. In position A, the Z components 71 of magnetic field vectors 72 do not contribute to the magnetostrictive effect on fiber 22. Two of the R components of the B field i.e., components 74 and 76, cause the phase of light propagating in fiber 22 to change in a direction directly opposite to the phase change due to R components 78 and 80. For a fiber 22 of uniform construction along its length, in a B field perfectly symmetric about axis 68, the net phase change due to the B field when fiber 22 is in position A is zero. If device 10 is adapted to output $|b|$ directly, the output of device 10 is also zero. Similarly, the output of device 10 will be zero for all points of symmetry in magnetic field B when fiber 22 lies in a plane of symmetry for such a point and reference point 70 is at the point of symmetry.

When fiber 22 is in a second position B where $\phi$=90° and R is nonzero, again Z components 82 will not contribute to a phase change in light propagating in fiber 22. Further, R components 84 will all add and a net phase change for light propagating in fiber 22 will be observed. For position B then, if fiber 22 is of uniform construction, device 10 will yield a nonzero result.

In a third position C, $\phi$ is zero, R is nonzero and center 70 lies in a plane perpendicular to magnetic axis 68 and containing magnetic center 69 (i.e., Z=0). In this orientation, only components in the Z direction contribute to a phase change in light propagating in fiber 22.

Three vectors 86, 88 and 90 are used to illustrate the magnetic field strength along a single magnetic field line 66 intercepting fiber 22 in position C. The Z components of vectors 86 and 90 are labeled components 92 and 94. Since center 70 is at Z=0, the entire vector 88 is in the Z direction. The R components 96 and 98 of vectors 86 and 90, do not contribute to magnetostriction.

FIG. 8 has treated magnetostrictive effects as the summation of discrete magnetic field line components but of course the integral formulation of equation 2 is the proper treatment. Further, since only components along fiber 22 contribute to magnetostriction, when $\phi$ is not equal to zero or 90°, the component of the magnetic field B which causes magnetostriction will be a combination of B field components in the Z and R directions.

Figure 9A:
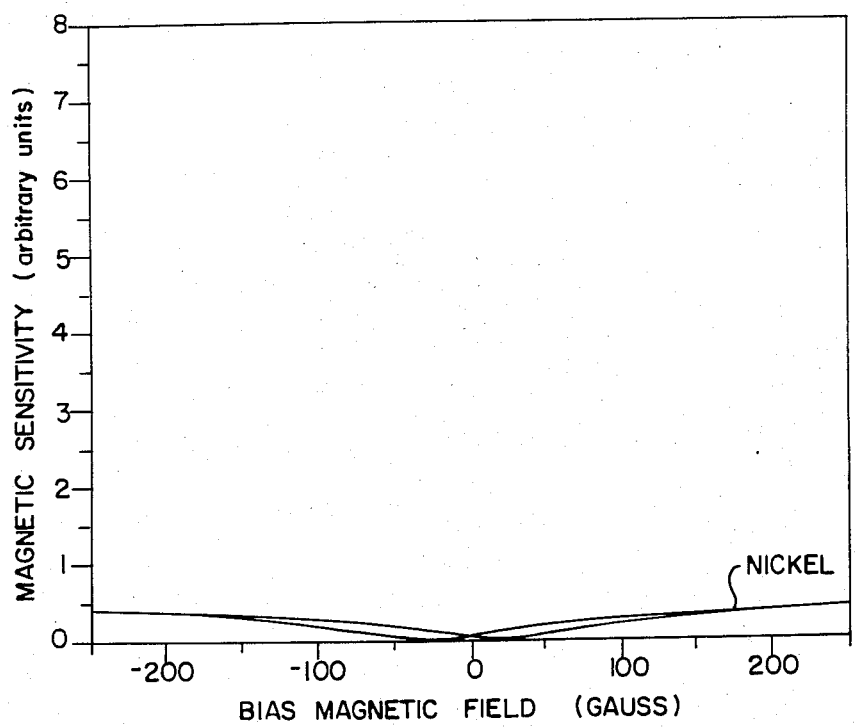
FIGS. 9(*a*), 9(*b*) and 9(c) are graphs of magnetic sensitivity of the interferometer for various coatings of the optical fiber.
Figure 9B:
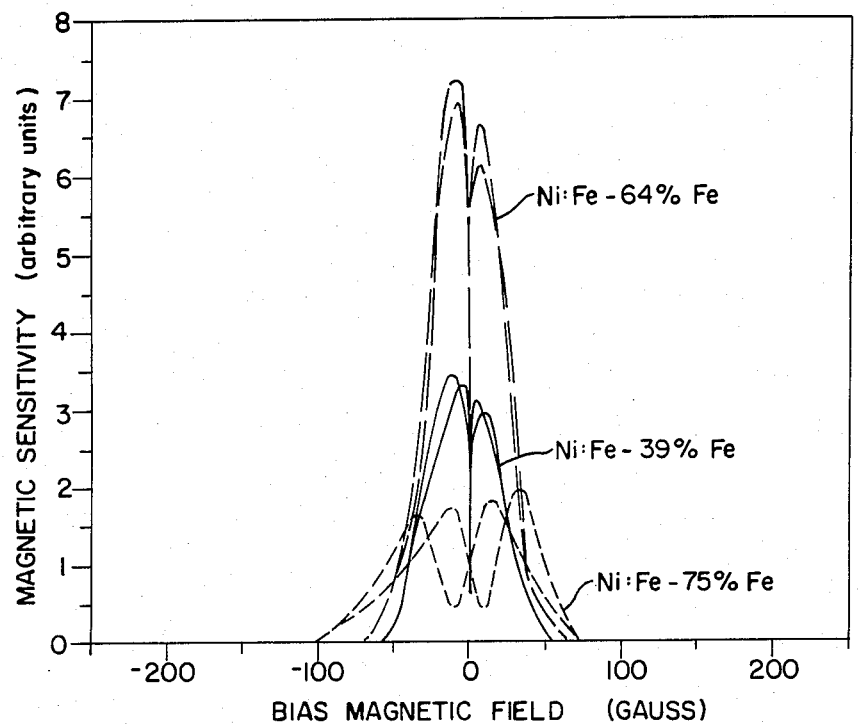
Figure 9C:
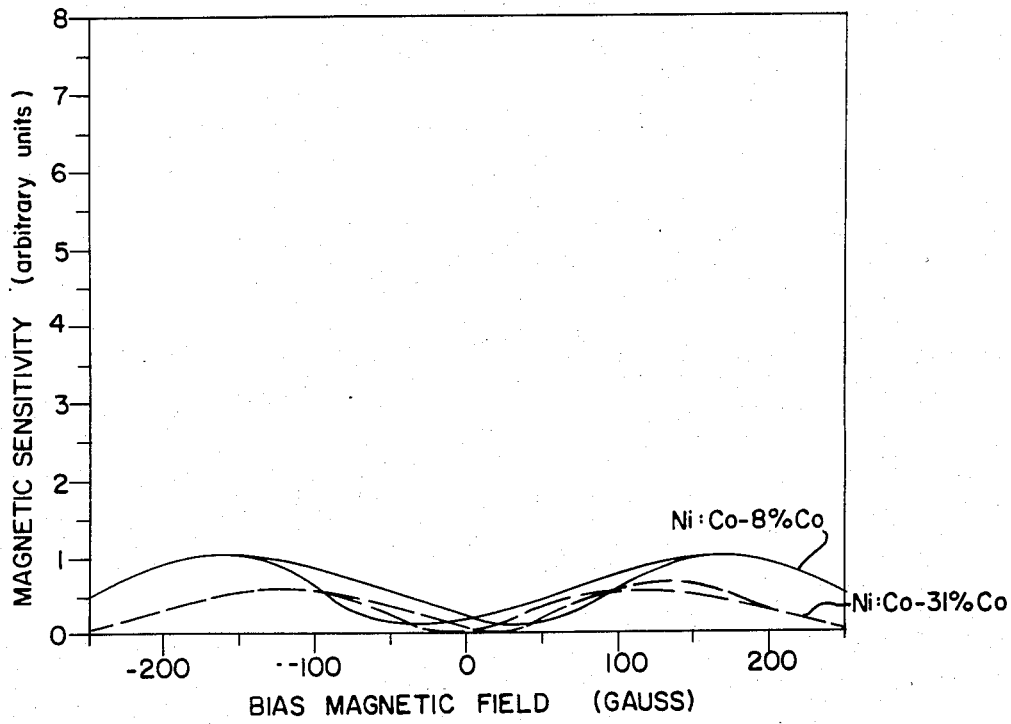

Magnetostrictive effects are known to saturate. By varying the ferromagnetic materials comprising cladding 38 or depositing alloys of these materials as cladding 38, the sensitivity and saturation of device 10 can be adjusted for the desired application. FIGS. 9(a), 9(b) and 9(c) show magnetic sensitivity versus magnetic field for several different ferromagnetic claddings 38 of the fiber 22. Double lines in FIG. 9 are due to hysteresis. At saturation the magnetic sensitivity is zero. As shown there are some coatings which have high sensitivity but saturate at low magnetic field values (i.e., 50 gauss) and other coatings with lower sensitivity that do not saturate until well past 250 gauss.

Because of saturation effects, if an increment dl of fiber 22 is subjected to a magnetic field component in the direction of 1 when such a component lies in the saturation region, the contribution of that increment to $|b|$ in equation 2 will be inaccurate. Thus, it is preferred that fiber 22 be oriented so that no points along fiber 22 are subjected to magnetic field components along fiber 22 which exceed the saturation strength of the particular combination of fiber 36 and cladding 38 employed as fiber 22.

Of particular advantage is to orient fiber 22 substantially transverse to the B field lines (i.e., $\phi$>45° for all B field lines crossed by fiber 22). In this case, when the B field in the region of interest lies in the saturation region, magnetostrictive saturation effects can be avoided if the B field components along fiber 22 are less than the saturation strength limit. By placing fiber 22 substantially transverse to the B field, the magnitude of the B field components along fiber 22 are substantially smaller than $|B|$ thus increasing the chance that the saturation limit will not be exceeded by B field components along fiber 22. Positions A and B in FIG. 8 are examples of this advantageous orientation.

Even when the |B| in the region of interest is less than the saturation limit, placement of fiber 22 substantially transverse to the B field lines is generally advantageous. For example, in position B in FIG. 8, the integral of the B field lying along fiber 22 (e.g., a sum of components 84) is smaller than the integral of the B field (e.g., a sum of components 88, 92 and 94) lying along fiber 22 (e.g., a sum of components 88, 92 and 94) in position C. Thus for small angular displacements $\delta$ of $\phi$, the variation in the integral of B along fiber 22 due to such angular displacements is smaller, as a percentage of the integral of B along fiber 22 for $\delta=0$, when fiber 22 is positioned substantially transverse to the field lines then the variation of such a line integral when fiber 22 is placed substantially along the field lines. That is, more sensitivity to variations in $\phi$ is afforded by placing fiber 22 substantially transverse to the B field lines. This allows for a more precise determination of the location of points corresponding to a predetermined value for |b| in equation 2.

If that predetermined value is zero, if fiber 22 is of uniform construction along its length and if the reference point for determining the B field is the center 70 of fiber 22, placement of fiber 22 substantially transverse to the magnetic field lines will provide a highly accurate null sensing device for locating symmetry points in a B field.

Figure 10:
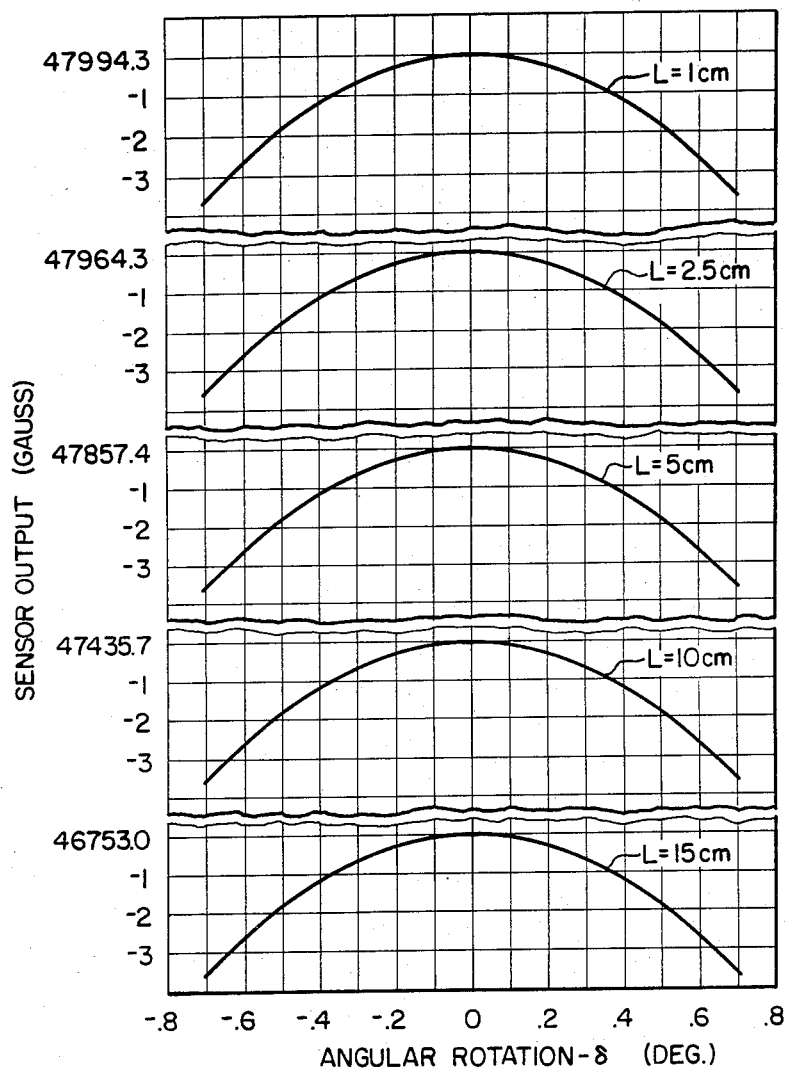
FIG. 10 is computer generated data using the coordinates of FIG. 7 showing interferometer output for angular rotation about $\phi=0°$ for several lengths of the sensor optical fiber in the magnetic field produced by a current loop.
Figure 11:
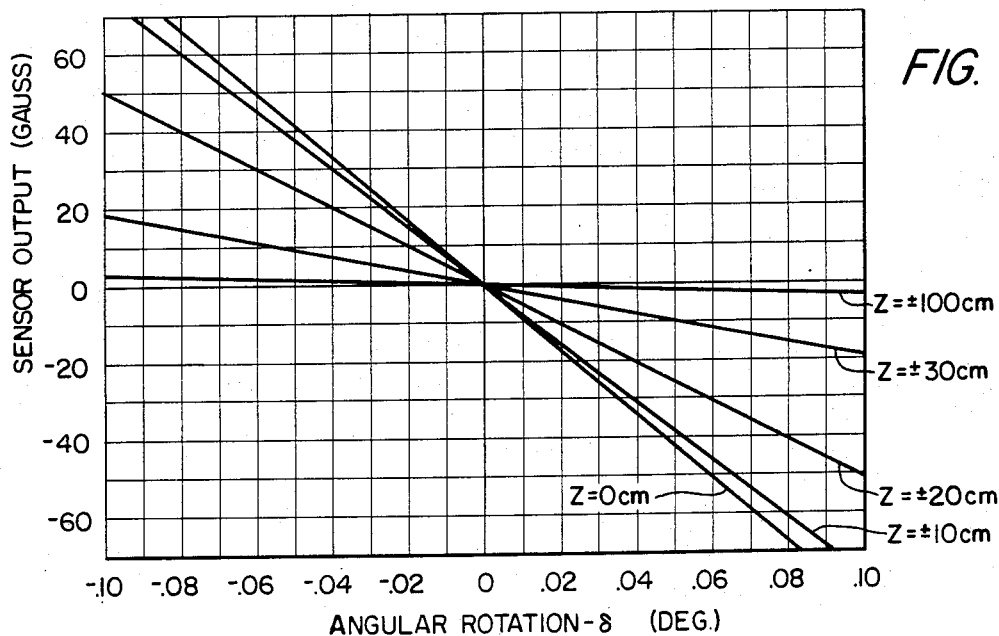
FIG. 11 is computer generated data using the coordinates of FIG. 7 showing interferometer output versus angular rotation about $\phi=90°$ with the sensor optical fiber at R=0 for several values of Z.
Figure 12:
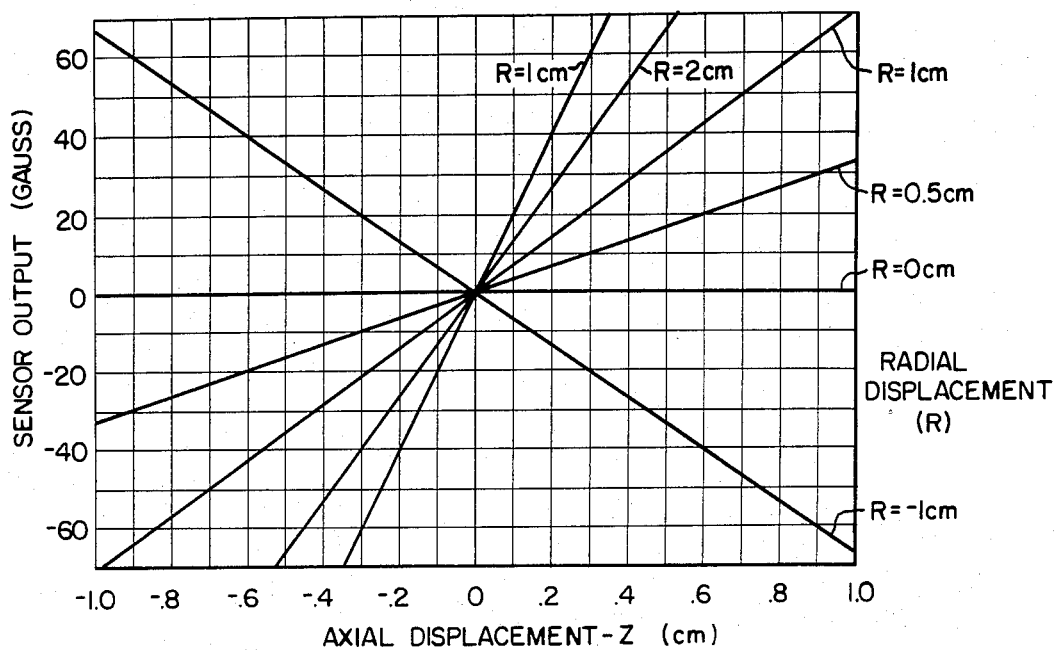
FIG. 12 is computer generated data using the coordinates of FIG. 7 showing interferometer output versus Z for $\phi=90°$ and for several values of R.
Figure 13:
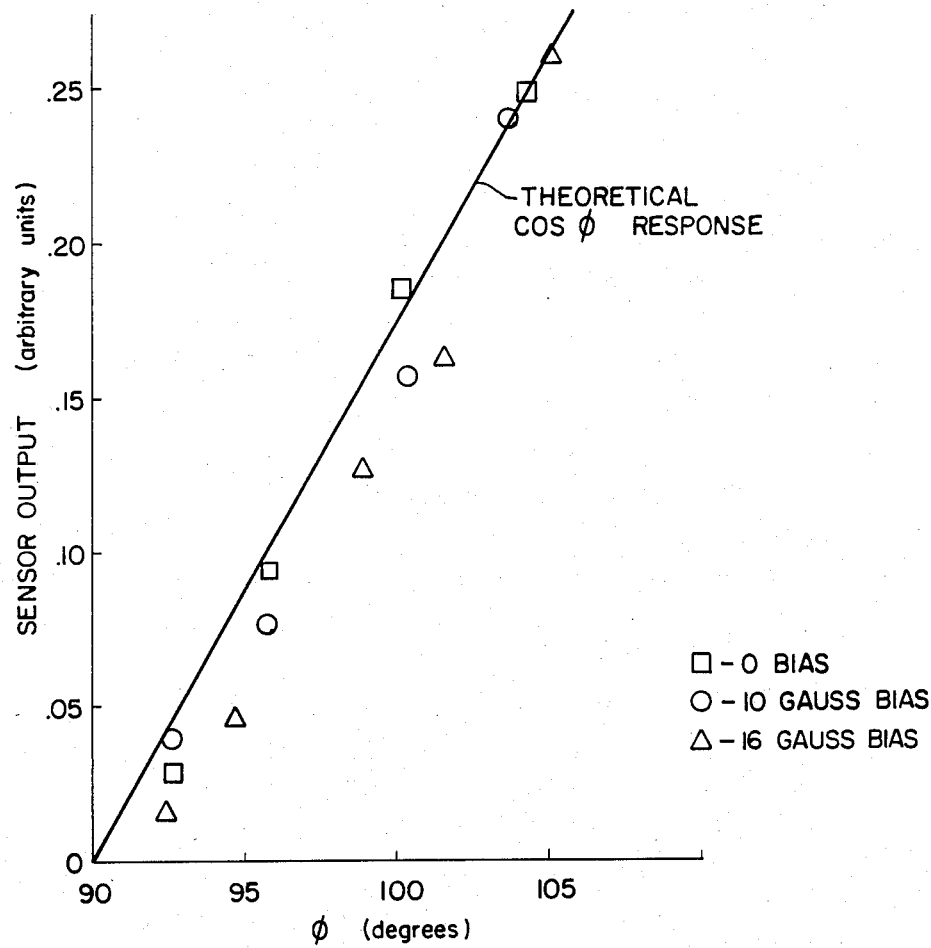
FIG. 13 is actual data showing the angular response of the interferometer.

FIGS. 10, 11, and 12 are computer generated data of the output |b| of device 10 for various configurations and orientations of fiber 22 in the field of FIG. 8. Fiber 22 was assumed to be a null sensing device as described immediately above. The modeling for the computer generated data was based on FIG. 7, i.e., the B field was assumed to be due to an ideal current loop and circular cylindrical coordinates were employed with $\phi$ defined as shown in FIG. 7. The model was selected to correspond to the basic field configuration expected in the torus confinement structure 52 of FIG. 4.

In FIG. 10, $\phi$ was set at 0° and R is equal to zero (i.e., fiber 22 lies along axis 68 in FIG. 8 with center 70 coincident with magnetic center 69). FIG. 10 illustrates the output |b| for various lengths of fiber 22 as a function of small angular displacements $\delta$ of $\phi$. For the field modeled for FIG. 10 and the lengths of fiber 22 used, device 10 is seen to be insensitive to fiber length. However, in general, the length of fiber 22 should remain less than the radius of curvature of the field lines being measured. FIG. 10 discloses the poor sensitivity of device 10 for $\delta$ within ±0.1°.

However, FIG. 11 illustrates that with $\phi$ equal to 90° and R equal to zero (i.e., position A in FIG. 8), the sensitivity of fiber 22 to angular displacements $\delta$ is dramatically increased. FIG. 12 gives the output of device 10 with $\phi$ equal to 90° for several values of R as a function of Z.

A method for accurately mapping magnetic fields with device 10 is indicated from the above. First, determine the general direction of magnetic field lines in the region of interest. This can be done by modeling or device 10 could be used to assist. Generally, |b| will be minimized (assuming no biasing) when fiber 22 is perpendicular to field lines and maximized when fiber 22 lies along the field lines. Thus scanning for minimum |b| with R and Z fixed will, with high precision, determine the direction of field lines at various points in space.

Next, position fiber 22 substantially transverse to the magnetic field lines. In the general three dimensional case, it is advantageous to maintain the angular orientation in space of fiber 22 constant while the region of interest is scanned for |b|. If there is sufficient change in the direction of the magnetic field lines so that maintaining the angular orientation in space of fiber 22 constant results in fiber 22 lying substantially along field lines at some point, the boundary (not shown) where the transition between fiber 22 lying substantially transverse to the B field lines and fiber 22 lying substantially along the field lines is preferably employed as a boundary of a new region to be mapped. At such a boundary, fiber 22 is preferably reoriented to again lie substantially transverse to the magnetic field lines while the new region is mapped.

A preferable method of mapping is to map in two dimensions, i.e., fiber 22 is held in a plane during each of several scans. In that case, using the coordinates of FIG. 7, holding the angular orientation of fiber 22 constant reduces to keeping $\phi$ constant. Preferably, one will also keep either R or Z constant, and scan the remaining variable, recording |b| at various points.

If device 10 is adapted to output a preset signal for a predetermined value of |b|, mapping could be accomplished as above with the location of a reference point on fiber 22 recorded each time the preset signal was obtained. Then, to check the precise location corresponding to the preset signal, $\phi$ could be varied by a small amount $\delta$ each time the preset signal is obtained. Changing the predetermined value of |b| to second and other values facilitates further mapping.

Magnetic field mapping can be simplified if the field contains at least one point about which the magnetic field is symmetric in at least one plane containing that point (i.e., a point of symmetry). For convenience, the preset signal could be zero and the first predetermined value of |b| zero. By the above mapping process, device 10 will thus serve as a null sensing device. By variously moving the fiber 22 in space, one will obtain a zero reading when the center 70 of fiber 22 is at the point of symmetry and fiber 22 lies in a plane of symmetry. If the B field has further symmetry characterized by an axis of symmetry, mapping is further simplified. For the null sensing configuration of device 10, a null output will be obtained when the center 70 of fiber 22 is on such a magnetic axis (e.g., axis 68 in FIG. 8) and $\phi$ equals 90°.

The method of the present invention is particularly advantageously employed in mapping the magnetic field due to a current loop modeled in FIGS. 7 and 8. The direction of magnetic field lines 66 are generally known and it is known that a magnetic axis 68 and magnetic center 69 exist in the B field. Adapting device 10 to function as a null sensing device when |b| equals zero, the magnetic field B of FIG. 8 is mapped as follows:

Step 1—Rotate and move fiber 22 until a zero output is obtained. Once a null has been found, the center 70 of fiber 22 is on magnetic axis 68 and perpendicular to axis 68 (i.e., $\phi$ equals 90°). Magnetic axis 68 can be followed by moving fiber 22 while maintaining a null output for device 10.

Step 2—Once magnetic axis 68 has been established, the magnetic center 69 can be found by moving the center 70 of fiber 22 off axis 68 and scanning with center 70 moving along a line parallel to axis 68, again searching for a null. This scan is conducted with φ equal to 90°. When a second null reading is obtained from device 10, fiber 22 will be located in a plane perpendicular to axis 68 which also contains magnetic center 69, i.e., Z equals zero.

Step 3—Magnetic field mapping can be completed by orienting fiber 22 along magnetic axis 68 and recording average field values given by |b| for various values of R and Z.

An alternate method of mapping would be similar to the first general method described but the angular orientation in space of fiber 22 would not be held constant. Instead, after the approximate direction of the field lines are determined and fiber 22 is placed substantially transverse to the lines, field line direction is determined by scanning with fiber 22 by rotating it about a point until a minimum output is obtained. Then fiber 22 is moved in small increments. After each move, the direction of the field lines is checked. By seeking a minimum output from device 10 at each stop, one will be assured that fiber 22 is perpendicular to the field lines at each stop point. Varying the angular orientation in space of fiber 22 slightly each time a minimum output is thought to have been obtained, will assist in determining field line direction as precisely as possible.

To measure the magnitude of the field lines, fiber 22 can be pointed along the field lines. Fiber 22 may be pointed along the field lines as fiber 22 is moved in small increments, with the output of device 10 being held constant. A small increment is a length which is small relative to the radius of curvature of the field lines of the magnetic field being measured.

A particularly advantageous feature of fiber 22 is that its radius is very small. If the mapping tolerances of the particular procedure are comparable to the thickness of fiber 22, the mapping procedure does not have to consider averaging the magnetic field over the sensor thickness. If the diameter of fiber 22 exceeded the mapping tolerances, then averaging the field over the magnetic sensor thickness would be required in order to precisely map the field.

In the fusion reactor experiment application, it is desirable to be able to map magnetic fields when magnets 54 are not cooled to a superconducting state. When the magnets 54 are warm however, resistive heating proportional to the square of the current passing through the coils of magnets 54 occurs. Without cryogenic cooling, damage can occur to the coil if the current is too high. The sensitivity shown by the computer generated data and experimental data indicates that milliamp currents are all that is needed to locate the magnetic axis 68 of FIG. 8 within ±0.025° and the magnetic center 69 of FIG. 8 to within ±0.1 millimeters. A further advantage to operating magnets 54 at a reduced current is the option of operating the magnets with an AC current. This gives the well known advantage of an increase in the signal to noise ratio since all slowly varying magnetic fields, such as the earth's magnetic field, can be filtered out. AC operation of magnets 54 also allow signal to 1/f-noise improvement in device 10.

Figure 14:
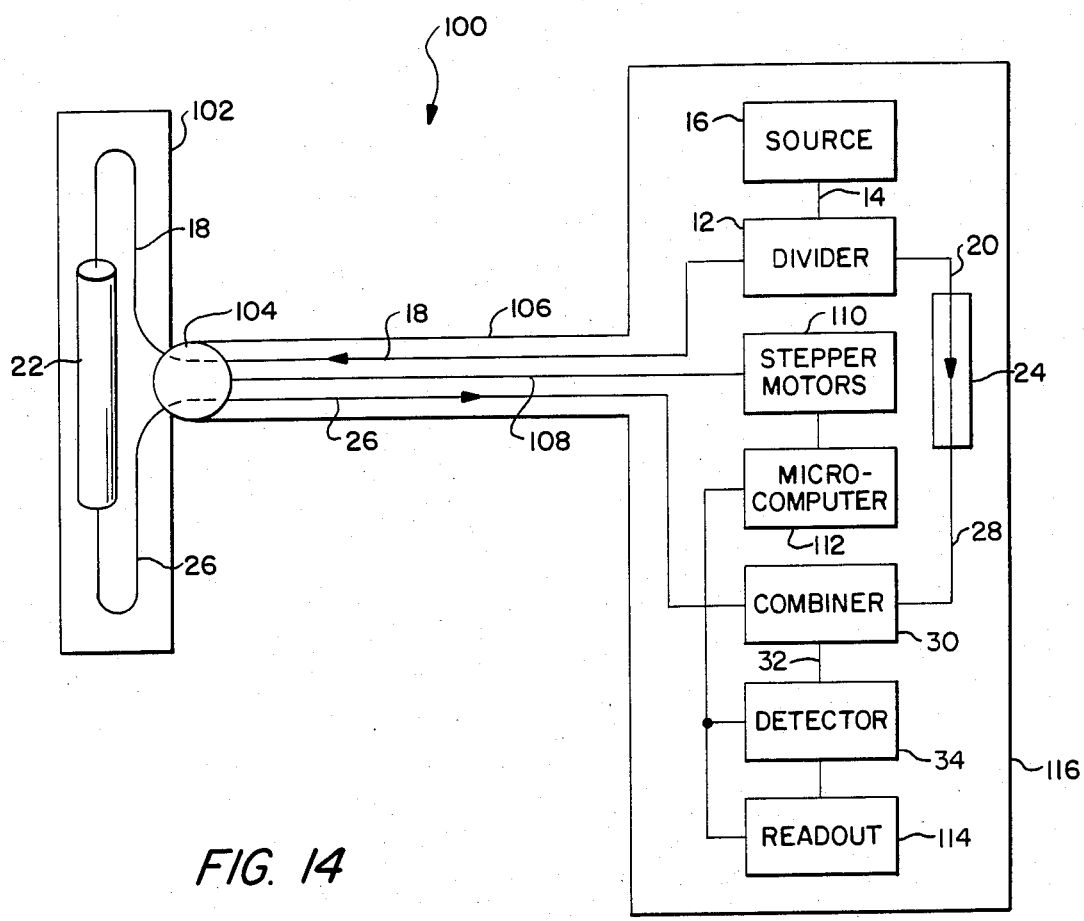
FIG. 14 is an apparatus for mapping magnetic fields.

An apparatus 100 for mapping magnetic fields in accordance with the above methods is shown in FIG. 14. Components common to devices 10 of FIG. 1 and 100 are numbered the same for clarity. In FIG. 14, fiber 22 is encased in probe 102 (which could be made of an epoxy or other nonmagnetic material). A means for positioning (including rotating) probe 102 is provided, for example, by a gimbal structure 104 which affords three degrees of freedom in combination with flexible arm 106, connectors such as rubber belts 108 and a motive means such as stepper motors 110. Three stepper motors 110 could be employed with each motor coupled to gimbal structure 104 by a separate rubber belt 108.

A microcomputer 112 could supplement the above components. Microcomputer 112 could be operatively associated with device 100 to variously position probe 102 in accordance with one of the mapping methods described above. This could involve microcomputer 112 receiving data from detectors 34 and driving stepper motors 110 in a feedback mode or driving stepper motors 110 independent (at least for part of the mapping) of the output at 32. Microcomputer 112 could also be employed to display output data in readout 114 in various forms.

For convenience, many of the components of device 100, including reference fiber 24, could be housed in a frame or casing 116.

What is claimed is:

1. A method of mapping at least a portion of a magnetic field with an interferometer having an output, wherein said interferometer includes an optical fiber sensitive to magnetic fields and clad with a magnetostrictive material, comprising:
    determining the approximate direction of the magnetic field lines of said magnetic field within said portion of said magnetic field;
    placing said optical fiber substantially transverse to said magnetic field lines;
    positioning said optical fiber variously within said magnetic field, while maintaining said optical fiber substantially transverse to said magnetic field lines; and
    recording said output for each of said various positions.

2. A method of mapping at least a portion of a magnetic field with an interferometer having an output, wherein said interferometer includes an optical fiber sensitive to magnetic fields, comprising:
    calibrating said interferometer to produce a preselected output for a predetermined value of the integral of said magnetic field along the length of said optical fiber;
    determining the approximate direction of the magnetic field lines of said magnetic field within said portion of said magnetic field;
    placing said optical fiber substantially transverse to said magnetic field lines;
    positioning said optical fiber variously within said magnetic field, while maintaining said optical fiber substantially transverse to said magnetic field lines, until said preselected output is produced by said interferometer;
    providing a reference point on said optical fiber; and
    recording the position of said reference point relative to a frame of reference each time said preselected output is produced by said interferometer.

3. The method of claim 2 wherein said predetermined value is zero.

4. The method of claim 2 wherein said adapting includes biasing said output so that said preselected output is a null when said integral equals zero.

5. The method of claim 2 wherein the angular orientation in space of said optical fiber is held constant during said positioning.

6. The method of claim 5, further including:
 redetermining the position of said magnetic field lines from said recorded positions;
 placing said sensor fibers substantially along at least one of said magnetic field lines at various locations; and
 determining the magnitude of said magnetic field at said at least one magnetic field line at said various locations.

7. A method of mapping points of symmetry in a magnetic field, with an interferometer having an output, wherein saidd interferometer includes an optical fiber sensitive to magnetic fields and clad with a magnetorestrictive material, comprising:
 providing a reference point on said optical fiber;
 calibrating said interferometer so that said output is a null when said reference poiknt is at one of said points of symmetry and said optical fiber lies in a plane wherein said magnetic field is symmetric about said one of said points of symmetry;
 placing said optical fiber in said magnetic field;
 positioning said optical fiber variously within said magnetic field until a null output is produced by said interferometer; and
 recording the position of said reference point relative to a frame of reference each time a null output is produced by said interferometer.

8. The method of claim 7 wherein said optical fiber is of uniform cross section and uniform construction along its length, and said reference point is at the center of the length of said optical fiber.

9. A method of mapping at least a portion of a magnetic field having a magnetic axis and a magnetic center on said axis, with an interferometer having an output, wherein said interferometer includes an optical fiber sensitive to magnetic fields and a reference point on said optical fiber, comprising:
 placing said optical fiber in said magnetic field;
 positioning said optical fiber in said magnetic field until said output is a first null;
 recording a first position of said reference point relative to a frame of reference when said first null is obtained;
 repositioning said optical fiber from said first position within said magnetic field, until said output is a second null;
 recording a second position of said reference point relative to a frame of reference when said second null is obtained;
 moving said sensor in a plane perpendicular to a first line including said first and second positions until said reference point is not on said first line; and
 moving said optical fiber so that said reference point moves along a second line parallel to said first line until said output is a third null.

10. The method of claim 9, further including:
 adapting said interferometer to produce a null output when the value of the integral of said magnetic field along the length of said sensor fiber is zero.

11. The method of claim 10 wherein said sensor fiber is of uniform cross section and uniform construction along its length, and said reference point is at the center of the length of said sensor fiber, so that said magnetic axis is coincident with said first line and said magnetic center is at the intersection of said magnetic axis and the plane perpendicular to said magnetic axis which contains said center of said optical fiber when said third null is obtained.

12. The method of claim 9, further including estimating the approximate position and direction of said magnetic axis; and
 placing said optical fiber substantially transverse to the direction of said magnetic axis during said steps of positioning and repositioning.

13. The method of claim 12, further including:
 placing said optical fiber along said magnetic axis at various locations; and
 determining the magnitude of said magnetic field at said locations.

14. A method of mapping at least a portion of a magnetic field with an interferometer having an output, wherein said interferometer includes an optical fiber sensitive to magnetic fields, comprising:
 selecting a reference point on said fiber;
 determining the approximate direction of the magnetic field lines of said magnetic field within said portion of said magnetic field;
 placing said optical fiber substantially transverse to said magnetic field lines;
 rotating said optical fiber about said reference point until a minimum output is obtained, so that the direction of said field lines at said reference point will be substantially perpendicular to said optical fiber when said minimum output is obtained; and
 moving said optical fiber a small increment while maintaining said output substantially constant so that a portion of a magnetic field line of a given intensity is mapped.

15. The method of claim 14 wherein said optical fiber is oriented substantially along said field lines during said moving.

16. The method of claim 15 further including:
 reorienting said optical fiber substantially transverse to said field lines after said moving; and
 rotating said fiber about said reference point until a second minimum output is obtained.

17. An apparatus for mapping at least a portion of a magnetic field wherein the direction of the magnetic field lines are generally known, said apparatus including an interferometer having an output, wherein said interferometer includes an optical fiber sensitive to magnetic fields and clad with a magnetorestrictive material, comprising:
 means for tracking the position of said fiber;
 means for monitoring said output;
 means for placing said optical fiber in said magnetic field and substantially transverse to said magnetic field lines;
 means for moving said optical fiber within said magnetic field;
 means for reorienting said optical fiber at selected locations in response to said tracking means so that said fiber is maintained substantially transverse to said magnetic field lines during said mapping;
 and means for recording said output at selected times, so that the magnetic field intensity at said various positions is mapped and magnetic field lines of given intensities are determined.

18. An apparatus for mapping at least a portion of a magnetic field with an interferometer having an output, wherein said interferometer includes an optical fiber sensitive to magnetic fields, clad with a magnetorestrictive material and said optical fiber has a reference point thereupon, comprising:
  means for monitoring said output;
  means for placing said optical fiber in said magnetic field and substantially transverse to said magnetic field lines;
  means for moving said optical fiber in small increments within said magnetic field;
  means for rotating said optical fiber about said reference point until a minimum output is obtained, said rotating means being responsive to said monitoring means and wherein said rotating means reorients said fiber to a position which maintains said output substantially constant as said fiber is moved by said moving means, so that the direction of said field lines at said reference point will be substantially perpendicular to said optical fiber when said minimum output is obtained, and so that a portion of a magnetic field line of a given intensity is mapped.

* * * * *